(12) United States Patent
Demuynck et al.

(10) Patent No.: US 7,139,958 B2
(45) Date of Patent: Nov. 21, 2006

(54) SYSTEM WITH INTERLEAVER AND DE-INTERLEAVER

(75) Inventors: Kris Gilbert Achiel Demuynck, Wilrijk (BE); Frank Octaaf Van der Putten, Leest (BE)

(73) Assignee: Alcatel, Paris (FR)

( * ) Notice: Subject to any disclaimer, the term of this patent is extended or adjusted under 35 U.S.C. 154(b) by 663 days.

(21) Appl. No.: 10/628,278

(22) Filed: Jul. 29, 2003

(65) Prior Publication Data
US 2004/0025100 A1    Feb. 5, 2004

(30) Foreign Application Priority Data
Aug. 5, 2002    (EP)    ................... 02291968

(51) Int. Cl.
*H04L 1/18*    (2006.01)
(52) U.S. Cl. ...................................... 714/751; 714/702
(58) Field of Classification Search ................ 711/132, 711/157; 714/749, 702, 751
See application file for complete search history.

(56) References Cited

U.S. PATENT DOCUMENTS

| | | | |
|---|---|---|---|
| 5,107,457 A * | 4/1992 | Hayes et al. ................. | 711/132 |
| 5,182,753 A * | 1/1993 | Dahlin et al. ................ | 714/749 |
| 5,592,492 A | 1/1997 | Ben-Efraim et al. | |
| 5,764,649 A | 6/1998 | Tong | |
| 5,991,857 A * | 11/1999 | Koetje et al. ................ | 711/157 |
| 6,014,761 A * | 1/2000 | Lachish et al. .............. | 714/702 |
| 6,226,720 B1 * | 5/2001 | Henderson et al. ......... | 711/157 |
| 6,629,219 B1 * | 9/2003 | Manseau ..................... | 711/157 |

FOREIGN PATENT DOCUMENTS

| | | |
|---|---|---|
| DE | 43 16 813 A1 | 11/1994 |
| EP | 0 681 373 A2 | 11/1995 |
| EP | 0 954 109 A2 | 11/1999 |

* cited by examiner

*Primary Examiner*—David Ton
(74) *Attorney, Agent, or Firm*—Sughrue Mion, PLLC

(57) ABSTRACT

Systems (1) with interleavers (2) for interleaving data units and with de-interleavers (3) for de-interleaving data units, are made more efficient and less complex by storing data units in the form of stacks in the memories (29,39) of said interleavers (2) and said de-interleavers (3), by calculating stack positions for data units to be (de)interleaved, and by adapting stacks through shifting before the interleaving or after the de-interleaving. Such a system (1) does not require more than [(N−1)(D−1)]/2 memory elements, the theoretical memory size for the block length N and the interleaving depth D. Said data units are stored at subsequent positions, with said data units at said subsequent positions being adapted through shifting before the interleaving or after the de-interleaving to further subsequent positions. An interleaver (2) comprises a calculator (21), a shifter (23) and an inserter (24). A de-interleaver (3) comprises a calculator (31), an extracter (34) and a shifter (33).

10 Claims, 3 Drawing Sheets

Figure 1:
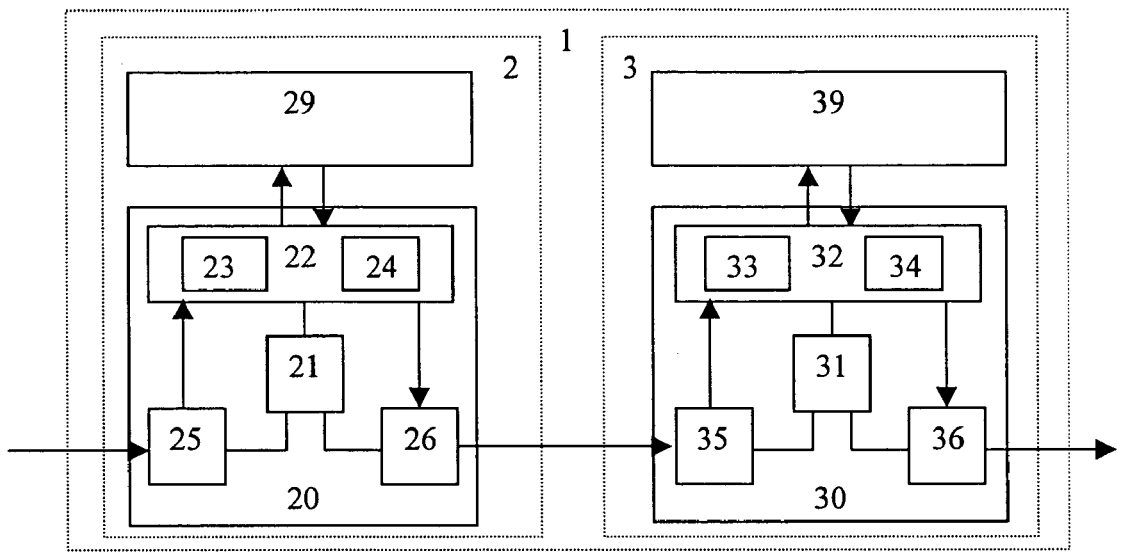

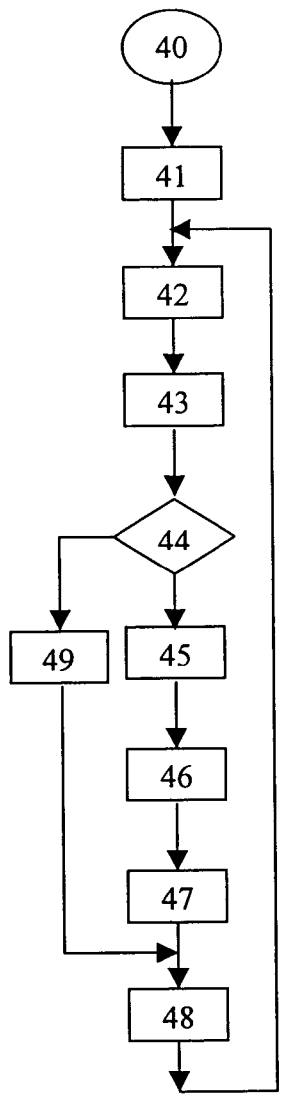
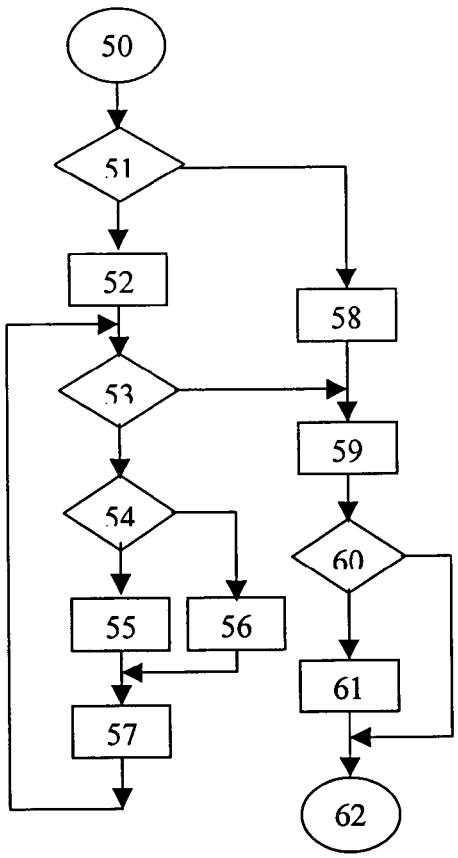
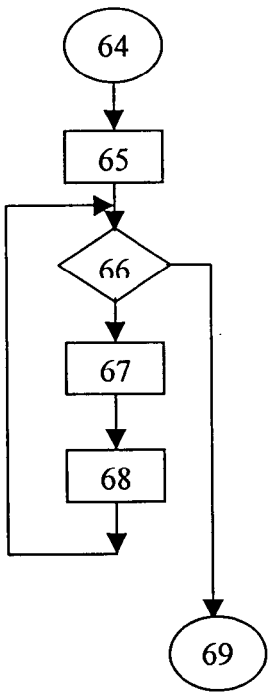
Fig. 3b    Fig. 3c
Fig. 3a

SYSTEM WITH INTERLEAVER AND DE-INTERLEAVER

The invention relates to a system comprising an interleaver for interleaving data units and a de-interleaver for de-interleaving data units, with said interleaver and said de-interleaver each comprising a memory.

A prior art system is known from U.S. Pat. No. 5,764,649, which discloses said interleaver and said de-interleaver each comprising a memory.

Generally, interleaving is for example defined by "block length" (N) and "interleaving depth" (D): An interleaver delays incoming data-units which are sent over a communication channel towards a de-interleaver. The incoming stream of data-units is cut into logical blocks of equal length (N). Each data-unit is delayed by the interleaver by an amount of (D−1)·i where i is the index of the data-unit within a logical block (i lies between 0 and N−1) and where D is called the "interleaving depth". The de-interleaver delays each data-unit by (D−1)·(N−i−1). Therefore, the total delay for each data-unit after interleaving and de-interleaving is equal to (D−1)·(N−1).

The known system as disclosed in U.S. Pat. No. 5,764,649 is disadvantageous, inter alia, due to requiring per (de) interleaver per memory [(N−1)(D−1)]/2+1 memory elements, plus a couple of arrays. Theoretically, just [(N−1)(D−1)]/2 memory elements per memory should be sufficient, with N being the block length and with D being the interleaving depth.

It is an object of the invention, inter alia, of providing a system as defined in the preamble which is more efficient and less complex.

The system according to the invention is characterised in that said memory stores data units in the form of at least one stack, with at least a part of a stack being shiftable for taking into account at least one calculated stack position.

By storing the data units in the form of stacks, by calculating stack positions for data units to be (de)interleaved, and by adapting stacks through shifting before the interleaving or after the de-interleaving, the system is of the lowest complexity and requires not more than the theoretical memory size.

The invention is based upon an insight, inter alia, that the prior art separate buffering and addressing of data units will require more memory size than strictly necessary, and is based upon a basic idea, inter alia, that the inventive combined storing and positioning of data units will be more efficient.

The invention solves the problem, inter alia, of providing a system as defined in the preamble which is more efficient and less complex, and is advantageous, inter alia, in that just the theoretical memory size of [(N−1)(D−1)]/2 memory elements is required.

A first embodiment of the system according to the invention as defined in claim 2 is advantageous in that said data units are stored at subsequent positions, with at least a part of said data units at at least a part of said subsequent positions being shiftable to further subsequent positions for taking into account said at least one calculated stack position.

By storing (read: locating) the data units at subsequent positions (and calculating stack positions for data units to be (de)interleaved as mentioned before), and by adapting at least a part of said data units at at least a part said subsequent positions through shifting to further subsequent positions, the system can be realised easily and low costly, entirely through hardware, entirely through software or through a mixture of both.

A second embodiment of the system according to the invention as defined in claim 3 is advantageous in that said interleaver further comprises a calculator for calculating at least one stack position for at least one data unit to be interleaved and comprises a shifter for in response to said calculating shifting at least a part of said data units in the stack for creating at least one open position for said at least one data unit to be interleaved and comprises an inserter for inserting said at least one data unit to be interleaved into said at least one open position.

Said interleaver is based upon creating an open position for a data unit to be interleaved by shifting other data units and then inserting said data unit to be interleaved.

A third embodiment of the system according to the invention as defined in claim 4 is advantageous in that said de-interleaver further comprises a calculator for calculating at least one stack position for at least one data unit to be de-interleaved from the stack and comprises an extracter for extracting said at least one data unit to be de-interleaved from said at least one stack position and comprises a shifter for in response to said calculating shifting at least a part of said data units in the stack for closing said at least one stack position.

Said de-interleaver is based upon extracting a data unit to be de-interleaved and then closing an open position resulting from said data unit being extracted and de-interleaved by shifting other data units.

The invention also relates to an interleaver for interleaving data units and comprising a memory.

The interleaver according to the invention is characterised in that said memory stores data units in the form of at least one stack, with at least a part of a stack being shiftable for taking into account at least one calculated stack position Embodiments of the interleaver according to the invention correspond with the first and second embodiment of the system according to the invention.

The invention yet also relates to a de-interleaver for de-interleaving data units and comprising a memory.

The de-interleaver according to the invention is characterised in that said memory stores data units in the form of at least one stack, with at least a part of a stack being shiftable for taking into account at least one calculated stack position.

Embodiments of the de-interleaver according to the invention correspond with the first and third embodiment of the system according to the invention.

The invention further relates to a method for interleaving data units via an interleaving memory and for de-interleaving data units via a de-interleaving memory.

This method according to the invention is characterised in that said method comprises the step of storing in each one of said memories data units in the form of at least one stack, with at least a part of a stack being shiftable for taking into account.

Embodiments of this method according to the invention correspond with the first, second and third embodiment of the system according to the invention.

The invention yet further relates to a method for (de) interleaving data units via a (de)interleaving memory.

That method according to the invention is characterised in that said method comprises the step of storing in said (de)interleaving memory data units in the form of at least one stack, with at least a part of a stack being shiftable for taking into account at least one calculated stack position Embodiments of that method according to the invention correspond with the first and second (first and third) embodiment of the system according to the invention.

The invention relates in addition to an interleaving processor program product for interleaving data units via an interleaving memory.

The interleaving processor program product according to the invention is characterised in that said interleaving processor program product comprises the function of storing in said interleaving memory data units in the form of at least one stack, with at least a part of a stack being shiftable for taking into account at least one calculated stack position.

Embodiments of the interleaving processor program product according to the invention correspond with the first and second embodiment of the system according to the invention.

The invention relates further in addition to a de-interleaving processor program product for de-interleaving data units via a de-interleaving memory.

The de-interleaving processor program product according to the invention is characterised in that said de-interleaving processor program product comprises the function of storing in said de-interleaving memory data units in the form of at least one stack, with at least a part of a stack being shiftable for taking into account at least one calculated stack position.

Embodiments of the de-interleaving processor program product according to the invention correspond with the first and third embodiment of the system according to the invention.

These and other aspects of the invention will be apparent from and elucidated with reference to the embodiments(s) described hereinafter.

Figures 2A, 2B:
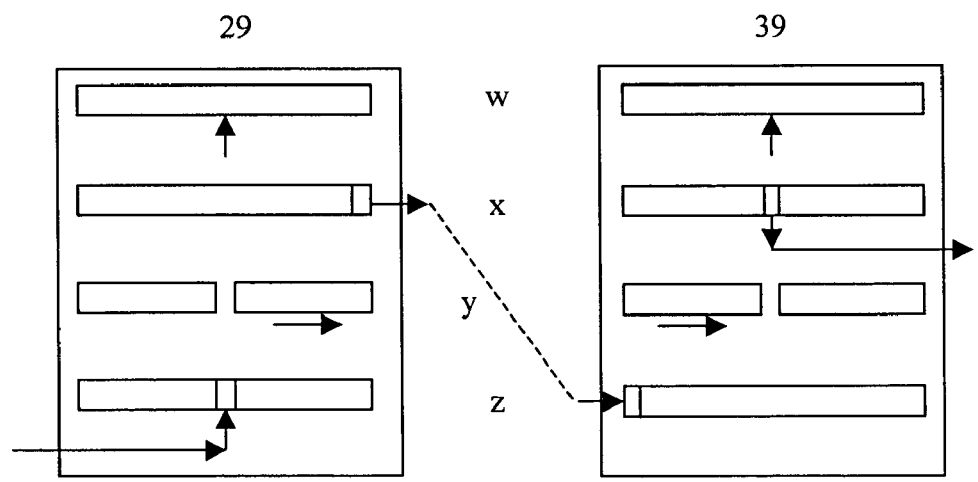
Figure 4A:
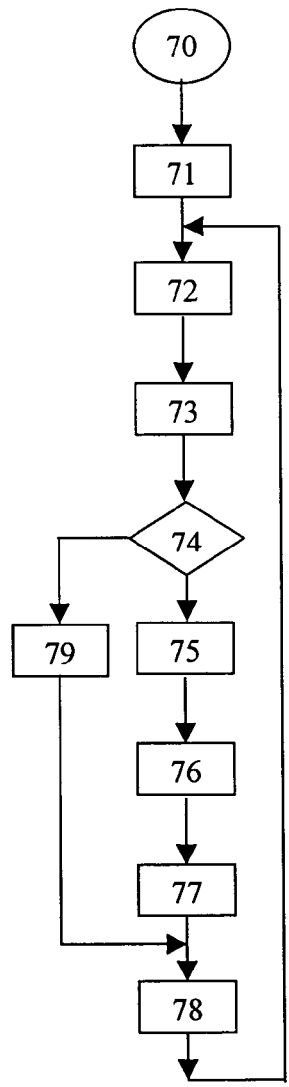
Figure 4B:
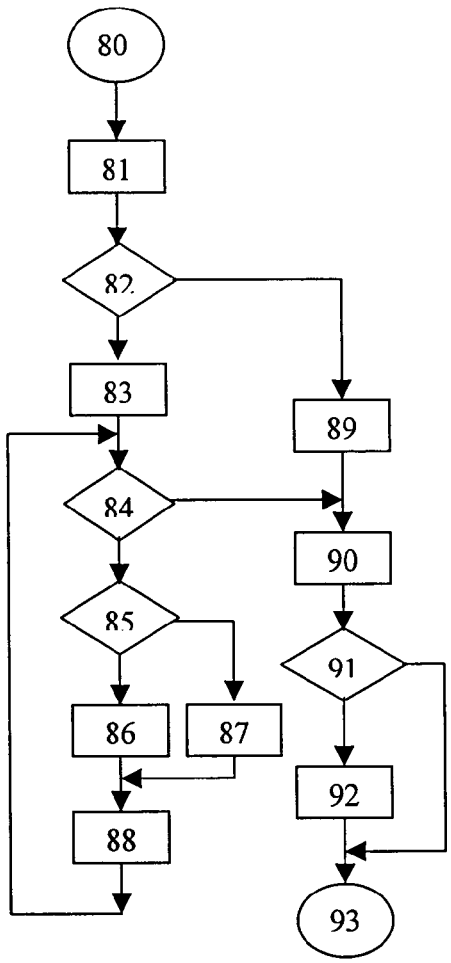
Figure 4C:
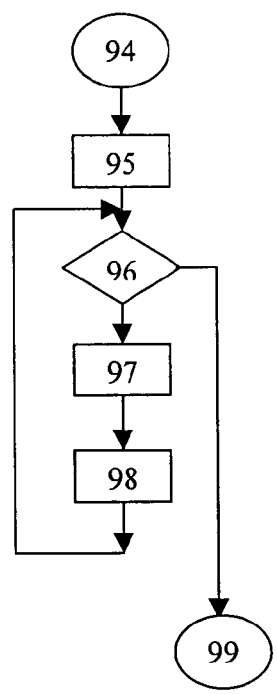

FIG. 1 illustrates in block diagram form a system according to the invention comprising an interleaver according to the invention and a de-interleaver according to the invention, FIG. 2 illustrates stacks in memories, with FIG. 2a disclosing stacks in an interleaving memory and with FIG. 2b disclosing stacks in a de-interleaving memory, FIG. 3 discloses an interleaving method according to the invention, with FIG. 3a disclosing the interleaving process, with FIG. 3b disclosing the interleaving calculating process and with FIG. 3c disclosing the interleaving shifting process, and FIG. 4 discloses a de-interleaving method according to the invention, with FIG. 4a disclosing the de-interleaving process, with FIG. 4b disclosing the de-interleaving calculating process and with FIG. 4c disclosing the de-interleaving shifting process.

The system 1 according to the invention disclosed in FIG. 1 comprises an interleaver 2 according to the invention and a de-interleaver 3 according to the invention.

Interleaver 2 comprises an interleaving controller 20 and an interleaving memory 29. Interleaving controller 20 comprises an interleaving input interface 25 for receiving data units to be interleaved and coupled to an interleaving memory interface 22 comprising an interleaving shifter 23 and an interleaving inserter 24. Interleaving memory interface 22 is further coupled to said interleaving memory 29 and to an interleaving output interface 26 for outputting interleaved data units. Interleaving controller 20 also comprises an interleaving calculator 21 coupled to said interleaving input interface 25, to said interleaving output interface 26 and to said interleaving memory interface 22.

De-interleaver 3 comprises a de-interleaving controller 30 and a de-interleaving memory 39. De-interleaving controller 30 comprises a de-interleaving input interface 35 for receiving interleaved data units to be de-interleaved and coupled to a de-interleaving memory interface 32 comprising a de-interleaving shifter 33 and a de-interleaving extracter 34. De-interleaving memory interface 32 is further coupled to said de-interleaving memory 39 and to a de-interleaving output interface 36 for outputting de-interleaved data units. De-interleaving controller 30 also comprises a de-interleaving calculator 31 coupled to said de-interleaving input interface 35, to said de-interleaving output interface 36 and to said de-interleaving memory interface 32.

Interleaving output interface 26 and de-interleaving input interface 35 are coupled via a communication channel like for example an Asymmetrical Digital Subscriber Line or ADSL connection.

In view of FIG. 2, the system 1 according to the invention functions as follows. In interleaver 2, interleaving memory 29 comprises a stack (w) of data units arrived via interleaving input interface 25 and supplied to and stored in interleaving memory 29 via interleaving memory interface 22. A next data unit to be interleaved and arriving at interleaving input interface 25 is supplied to interleaving memory interface 22, with interleaving calculator 21 being informed and calculating the stack position for this next data unit to be interleaved. This stack position is shown in FIG. 2a(w) by the vertical arrow and is supplied from interleaving calculator 21 to interleaving memory interface 22. Of said stack (x), the data unit most right is read out and sent to de-interleaver 3 via interleaving memory interface 22 and interleaving output interface 26, as shown in FIG. 2a(x). Interleaving shifter 23 shifts the right part of said stack (y) to the right, deleting or overwriting said most right data unit, as shown in FIG. 2a(y), and interleaving inserter 24 inserts said data unit into the open position in said stack (z) as shown in FIG. 2a(z). This inserting of said data unit is done without separately buffering this data unit, in other words said interleaving calculator 21, said interleaving shifter 23 and said interleaving inserter 24 are fast modules, either realised through hardware or realised through software running on a fast processor, or through a combination of both.

In de-interleaver 3, said data unit originating from interleaver 2 arrives at de-interleaving input interface 35 and is supplied to and stored in de-interleaving memory 39 via de-interleaving memory interface 32. De-interleaving memory 39 comprises a stack (w) of data units. For a data unit to be de-interleaved, de-interleaving calculator 31 calculates the stack position for this data unit to be de-interleaved. This stack position is shown in FIG. 2b(w) by the vertical arrow and is supplied from de-interleaving calculator 31 to de-interleaving memory interface 32. De-interleaving extracter 34 extracts this data unit from said stack (x), as shown in FIG. 2b(x), which extracted data unit is supplied via de-interleaving memory interface 32 to de-interleaving output interface 36. De-interleaving shifter 33 shifts the left part of said stack (y) to the right, creating an empty space in the most left position of the de-interleaving memory 39, as shown in FIG. 2a(y). The extracting of said data unit is done without separately buffering this data unit, in other words said de-interleaving calculator 31, said de-interleaving shifter 33 and said de-interleaving extracter 24 are fast modules, either realised through hardware or realised through software running on a fast processor, or through a combination of both. A new data unit arriving from interleaver 2 can now be shifted most left of said stack (z), as shown in FIG. 2a(z).

It should be observed, for the interleaving process firstly a position is calculated and then a data unit to be sent is read out from a side position, after which shifting takes place and an arriving data unit is inserted at the calculated position, where for the de-interleaving process firstly a position is calculated and then a data unit to be sent is extracted from that calculated position after which shifting takes place and an arriving data unit is written at a side position. These processes have proven to be advantageous. But of course, for each one of said processes, one or more alternatives are possible too (like for example for the interleaving process firstly calculating a position and then extracting a data unit to be sent from the calculated position, after which shifting takes place and an arriving data unit is written at a side position, and for example for the de-interleaving process firstly calculating a position and then reading out a data unit to be sent from the side position after which shifting takes place and an arriving data unit is inserted at the calculated position). Each block shown or not shown in FIG. 1 can be combined with any other block shown or not shown and can be divided into one or more subblocks and can be relocated in view of other blocks and then be used for alternative embodiments without departing from the scope of this invention. And further blocks like for example—as shown in said prior art US patent—modulators and demodulators etc. and further parts in said blocks shown or not shown like for example filters and amplifiers and slicers etc. are not to be excluded.

In FIG. 3, the following blocks have the following meaning:

Block 40: Start, goto 41;
Block 41: Set I=0, goto 42;
Block 42: Set VALUE=read data unit from input (25), goto 43;
Block 43: Calculate POSITION (see FIG. 3b), goto 44;
Block 44: Is I≠1? If yes goto 45, if no goto 49;
Block 45: Set RESULT=STACK (0), goto 46;
Block 46: Shift STACK (see FIG. 3c), goto 47;
Block 47: Set STACK(position)=VALUE, goto 48;
Block 48: Write RESULT to output (26), goto 42;
Block 49: Set RESULT=VALUE, goto 48.
Block 50: Start, goto 51;
Block 51: Is I≠0? If yes goto 52, if no goto 58;
Block 52: Set POSITION=−1, Set J=1, goto 53;
Block 53: Is J<D? If yes goto 54, if no goto 59;
Block 54: Is I>J·N/D? If yes goto 55, if no goto 56;
Block 55: Set POSITION=POSITION+J·N/D, goto 57;
Block 56: Set POSITION=POSITION+I, goto 57;
Block 57: Set J=J+1, goto 53;
Block 58: Set POSITION=0, goto 59;
Block 59: Set I=I+1, goto 60;
Block 60: Is I=N? If yes, goto 61, if no goto 62;
Block 61: Set I=0, goto 62;
Block 62: Done.
Block 64: Start, goto 65;
Block 65: Set C=0, goto 66;
Block 66: Is C<POSITION? If yes, goto 67, if no goto 69;
Block 67: Set STACK (C)=STACK (C+1), goto 68;
Block 68: Set C=C+1, goto 66;
Block 69: Done.

In FIG. 4, the following blocks have the following meaning:

Block 70: Start, goto 71;
Block 71: Set I=0, goto 72;
Block 72: Set VALUE=read data unit from input (35), goto 73;
Block 73: Calculate POSITION (see FIG. 4b), goto 74;
Block 74: Is K≠0? If yes goto 75, if no goto 79;
Block 75: Set RESULT=STACK (POSITION), goto 76;
Block 76: Shift STACK (see FIG. 4c), goto 77;
Block 77: Set STACK(0)=VALUE, goto 78;
Block 78: Write RESULT to output (36), goto 72;
Block 79: Set RESULT=VALUE, goto 78.
Block 80: Start, goto 81;
Block 81: Set K=[(D−1)·(N−1)−I−1] mod N
Block 82: Is K≠0? If yes goto 83, if no goto 89;
Block 83: Set POSITION=−1, Set J=1, goto 84;
Block 84: Is J<D? If yes goto 85, if no goto 90;
Block 85: Is K>J·N/D? If yes goto 86, if no goto 87;
Block 86: Set POSITION=POSITION+J·N/D, goto 88;
Block 87: Set POSITION=POSITION+K, goto 88;
Block 88: Set J=J+1, goto 84;
Block 89: Set POSITION=0, goto 90;
Block 90: Set I=I+1, goto 91;
Block 91: Is I=N ? If yes, goto 92, if no goto 93;
Block 92: Set I=0, goto 93;
Block 93: Done.
Block 94: Start, goto 95;
Block 95: Set C=POSITION, goto 96;
Block 96: Is C>0? If yes, goto 97, if no goto 99;
Block 97: Set STACK (C)=STACK (C−1), goto 98;
Block 98: Set C=C−1, goto 96;
Block 99: Done.

In FIGS. 3 and 4, I is the current offset of the data-unit within a logical block of length N, VALUE is the value of the data-unit read from the input (25, 35), POSITION is the calculated position within the stack (21, 31), RESULT is the value of the data-unit that is sent to the output (26, 36), STACK is the stack (memory) (21, 31) which has a size of (N−1)(D−1)/2, K is only used in de-interleaving (subsitutes I in the calculation), J is a counter and C is a counter. The inputs are N being the block length in number of data-units and D being the interleaving depth. All variables are integers, so in case of dividing, the parts after the decimal point are to be ignored.

Each block shown in FIGS. 3 and 4 could be a (further) substep of the method for interleaving data units and/or of the method for (de)interleaving data units and/or could be a (further) subfunction of the interleaving processor program product for interleaving data units and/or of the de-interleaving processor program product for de-interleaving data units.

For each (sub)step of the methods according to the invention and/or for each (sub)function of the processor program products according to the invention it is observed that although for the interleaving process the first calculation and the second reading out (from a side position) and the third shifting and the fourth insertion (at a calculated position) and for the de-interleaving process the first calculation and the second extraction (from a calculated position) and the third shifting and the fourth writing (at a side position) have proven to be advantageous, as described before, one or more alternatives are not to be excluded and can be used for alternative embodiments without departing from the scope of this invention.

Each block shown in FIGS. 3 and 4 corresponds with one or more fast modules, either realised through hardware or realised through software running on a fast processor, or through a combination of both. Although the embodiments shown in the figures and (parts of) the introduction are related to convolutional interleaving, the invention is not to be limited to this kind of interleaving. It is within the scope of this invention that the system according to the invention, the interleaver according to the invention, the de-interleaver according to the invention, the methods according to the invention and the processor program products according to the invention can be used for other kinds of interleaving as well, like for example block interleaving etc.

The invention claimed is:

1. System (1) comprising an interleaver (2) for interleaving data units and a de-interleaver (3) for de-interleaving data units, with said interleaver (2) and said de-interleaver (3) each comprising a memory (29,39), characterised in that said memory (29,39) stores data units in the form of at least one stack, with at least a part of a stack being shiftable for taking into account at least one calculated stack position.

2. System (1) according to claim 1, characterised in that said data units are stored at subsequent positions, with at least a part of said data units at at least a part of said subsequent positions being shiftable to further subsequent positions for taking into account said at least one calculated stack position.

3. System (1) according to claim 1, characterised in that said interleaver (2) further comprises a calculator (21) for calculating at least one stack position for at least one data unit to be interleaved and comprises a shifter (23) for in response to said calculating shifting at least a part of said data units in the stack for creating at least one open position for said at least one data unit to be interleaved and comprises an inserter (24) for inserting said at least one data unit to be interleaved into said at least one open position.

4. System (1) according to claim 1, characterised in that said de-interleaver (3) further comprises a calculator (31) for calculating at least one stack position for at least one data unit to be de-interleaved from the stack and comprises an extracter (34) for extracting said at least one data unit to be de-interleaved from said at least one stack position and comprises a shifter (33) for in response to said calculating shifting at least a part of said data units in the stack for closing said at least one stack position.

5. Interleaver (2) for interleaving data units and comprising a memory, characterised in that said memory (29) stores data units in the form of at least one stack, with at least a part of a stack being shiftable for taking into account at least one calculated stack position.

6. De-interleaver (3) for de-interleaving data units and comprising a memory, characterised in that said memory (39) stores data units in the form of at least one stack, with at least a part of a stack being shiftable for taking into account at least one calculated stack position.

7. Method for interleaving data units via an interleaving memory (29) and for de-interleaving data units via a de-interleaving memory (39), characterised in that said method comprises the step of storing in each one of said memories (29,39) data units in the form of at least one stack, with at least a part of a stack being shiftable for taking into account at least one calculated stack position.

8. Method for (de)interleaving data units via a (de)interleaving memory (29,39), characterised in that said method comprises the step of storing in said (de)interleaving memory (29,39) data units in the form of at least one stack, with at least a part of a stack being shiftable for taking into account at least one calculated stack position.

9. Interleaving processor program product for interleaving data units via an interleaving memory (29), characterised in that said interleaving processor program product comprises the function of storing in said interleaving memory (29) data units in the form of at least one stack, with at least a part of a stack being shiftable for taking into account at least one calculated stack position.

10. De-interleaving processor program product for de-interleaving data units via a de-interleaving memory (39), characterised in that said de-interleaving processor program product comprises the function of storing in said de-interleaving memory (39) data units in the form of at least one stack, with at least a part of a stack being shiftable for taking into account at least one calculated stack position.

* * * * *